United States Patent
Chen et al.

(10) Patent No.: US 10,284,124 B2
(45) Date of Patent: May 7, 2019

(54) MOTOR DIVING CIRCUIT

(71) Applicant: ANPEC ELECTRONICS CORPORATION, Hsinchu (TW)

(72) Inventors: Kun-Min Chen, Hsinchu (TW); I-Lin Chiu, New Taipei (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 15/663,666

(22) Filed: Jul. 28, 2017

(65) Prior Publication Data

US 2018/0269816 A1    Sep. 20, 2018

(30) Foreign Application Priority Data

Mar. 17, 2017  (TW) .............................. 106108945 A

(51) Int. Cl.

| | |
|---|---|
| H02P 7/28 | (2016.01) |
| H02P 6/08 | (2016.01) |
| H02P 6/20 | (2016.01) |
| H03K 17/0814 | (2006.01) |
| H02M 1/08 | (2006.01) |
| H02M 7/5387 | (2007.01) |
| H02M 1/00 | (2006.01) |

(52) U.S. Cl.
CPC .............. *H02P 7/28* (2013.01); *H02M 1/08* (2013.01); *H02M 7/5387* (2013.01); *H02P 6/08* (2013.01); *H02P 6/20* (2013.01); *H03K 17/08142* (2013.01); *H03K 17/08146* (2013.01); *H02M 2001/0029* (2013.01)

(58) Field of Classification Search
CPC ...... H02K 41/03; H02K 41/031; H02P 25/06; B60L 15/005; B60L 2200/26
USPC .................................................. 318/135, 494
See application file for complete search history.

(56) References Cited

U.S. PATENT DOCUMENTS

2009/0243529 A1* 10/2009 Lee ......................... H02P 7/285
                                                          318/494

* cited by examiner

*Primary Examiner* — Kawing Chan
*Assistant Examiner* — Bradley R Brown
(74) *Attorney, Agent, or Firm* — Li & Cai Intellectual Property (USA) Office

(57) ABSTRACT

A motor driving circuit for receiving a control signal to output at least one output current for driving a motor is provided. The motor driving circuit includes an input module, a gain module, an output module, a first slew rate limiting module, and a second slew rate limiting module. The first slew rate limiting module has a first limiting parameter. The second slew rate includes a second limiting parameter. An output current is outputted by the output terminal. When a rising slew rate of the output current is less than a first slew rate value, the first slew rate limiting module does not operate. When the rising slew rate of the output current is greater than the first slew rate value, the motor driving circuit limits the rising slew rate of the output current based on the first limiting parameter of the first slew rate limiting module.

18 Claims, 3 Drawing Sheets

MOTOR DIVING CIRCUIT

BACKGROUND

1. Technical Field

The present disclosure relates to a motor driving circuit, and in particular, to a motor driving circuit for limiting the slew rate of the output current.

2. Description of Related Art

The switching driving circuit of the voice coil motor normally outputs a small output current that is 10 uA. It is necessary to adjust parameters of the amplifier circuit, such as compensation capacitance, Gate-Drain capacitance (Cgd), and internal current source for adjusting the slew rate of the output current. However, under the circumstances it would influence the bandwidth and the phase margin of the amplifier, which not only raises the manufacturing cost, but also increases the changes in the chip parameters. In addition, the slew rate control is usually used to avoid noise, and the slew rate specification is between 55V/us and 65V/us. Consequently, only adjusting the parameters of the driving circuit and the output switches is difficult to linearly and accurately control the slew rate in a small range.

Therefore, providing a motor driving circuit for linearly and accurately controlling the slew rate of the output current is an important issue in the industry.

SUMMARY

In order to achieve the above purposes, a motor driving circuit for receiving a control signal to output at least one output current for driving a motor is provided, and the motor driving circuit includes: an input module for receiving the control signal and transforming the control signal as an input signal; a gain module electrically connected to the input module for receiving and amplifying the input signal; an output module electrically connected to the gain module, wherein the output module includes an output terminal; the output module including: a first output switch including a first terminal, second terminal and a third terminal, wherein the second terminal of the first output switch is used for receiving a first output control signal of the gain module; a second output switch including a first terminal, a second terminal and a third terminal, wherein the second terminal of the second output switch is used for receiving a second output control signal of the gain module, and the first terminal of the second output switch is electrically connected to the third terminal of the first output switch; a first slew rate limiting module including a first limiting terminal and a second limiting terminal, the first limiting terminal electrically connected to the output terminal of the output module, and the second limiting terminal electrically connected to the second terminal of the first output switch, wherein the first slew rate limiting module has a first limiting parameter; and a second slew rate limiting module including a first limiting terminal and a second limiting terminal, the first limiting terminal electrically connected to the output terminal of the output module, and the second limiting terminal electrically connected to the second terminal of the second output switch, wherein the second slew rate includes a second limiting parameter; wherein an output current is outputted through the output terminal; when a rising slew rate of the output current is less than a first slew rate value, the first slew rate limiting module does not operate; when the rising slew rate of the output current is greater than the first slew rate value, the motor driving circuit limits the rising slew rate of output current based on the first limiting parameter of the first slew rate limiting module.

In order to achieve the above purposes, a motor driving circuit receiving a control signal to output at least one output current for driving a motor is provided, and the motor driving circuit includes: an input module receiving the control signal and transforming the control signal an in input signal; a gain module electrically connected to the input module for receiving and amplifying the input signal; an output module electrically connected to the gain module, wherein the output module includes an output terminal, the output module including: a first output switch including a first terminal, a second terminal and a third terminal, wherein the second terminal of the first output switch is used for receiving a first output control signal of the gain module; a second output switch including a first terminal, a second terminal and a third terminal, wherein the second terminal of the second output switch is used for receiving a second output control signal of the gain module, the first terminal of the second output switch is electrically connected to the third terminal of the first output switch; and a first slew rate limiting module including a first limiting terminal and a second limiting terminal, the first limiting terminal electrically connected to the output terminal of the output module, the second limiting terminal electrically connected to the second terminal of the first output switch, wherein the first slew rate limiting module includes a first limiting parameter; wherein an output current is outputted by the output terminal of the output module; when a rising slew rate of the output current is less than a first slew rate value, the first slew rate limiting module does not operate; when the rising slew rate of the output current is greater than the first slew rate value, the motor driving circuit limits the rising slew rate of the output current based on the first limiting parameter of the first slew rate limiting module.

According to the above, in the amplifier-type motor driving circuit of the present disclosure, the first output switch and the second switch are electrically and respectively connected to a slew rate limiting module. Regardless of the direction of the output current, the rising slew rate and the falling slew rate can be limited in a range. In addition, the circuit of the slew rate limiting module has a simple design and is separated from the original driving circuit. Accordingly, the parameters of the original driving circuit are not influenced, and the rising slew rate and the falling slew rate can be effectively adjusted. In addition, the process yield can be improved and cost-effective, thereby reducing the development schedule of driving devices.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the present disclosure.

DESCRIPTION OF THE EXEMPLARY EMBODIMENTS

Figure 1:
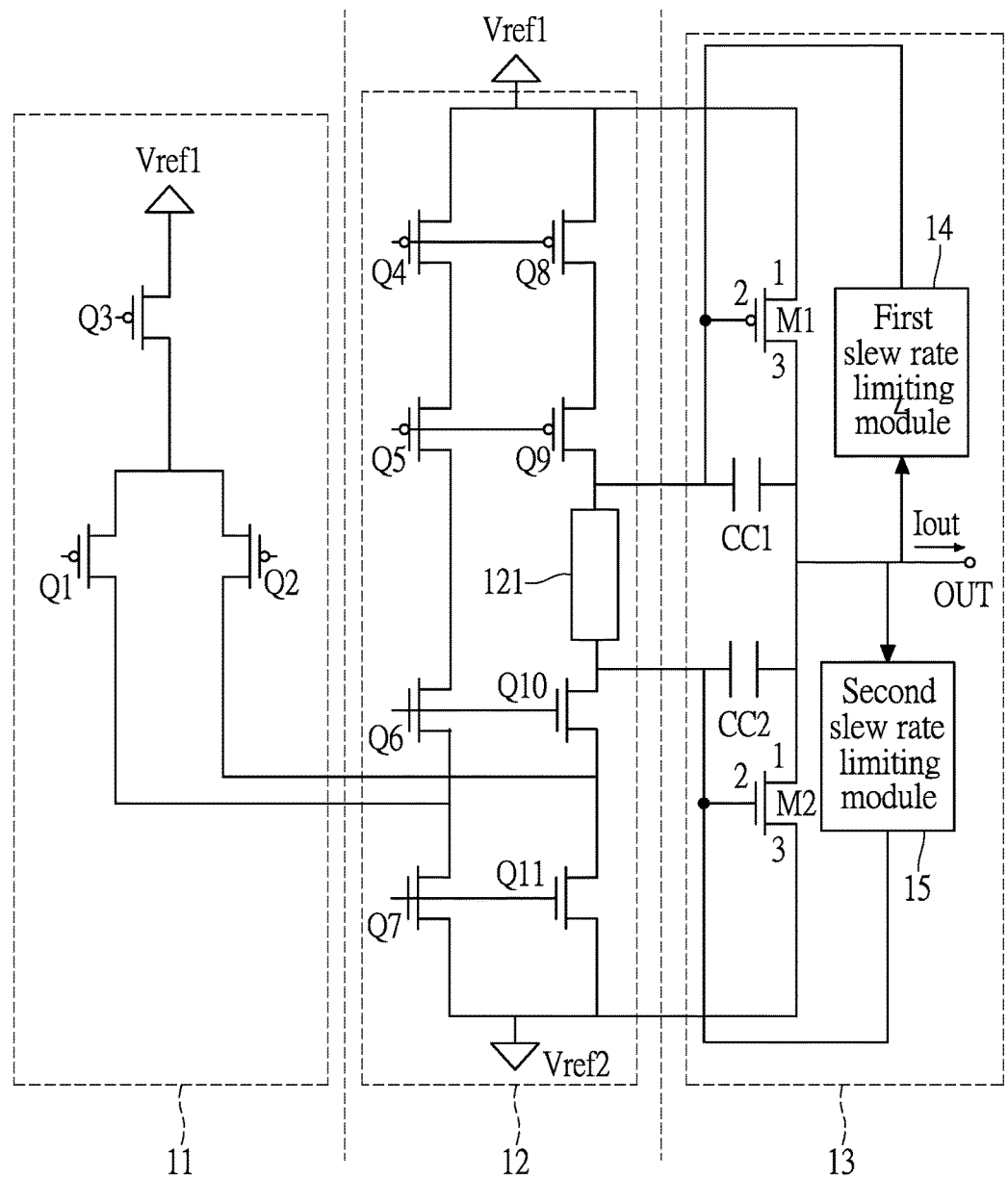
FIG. 1 is a schematic diagram of a motor driving circuit according to an embodiment of the present disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 2A:
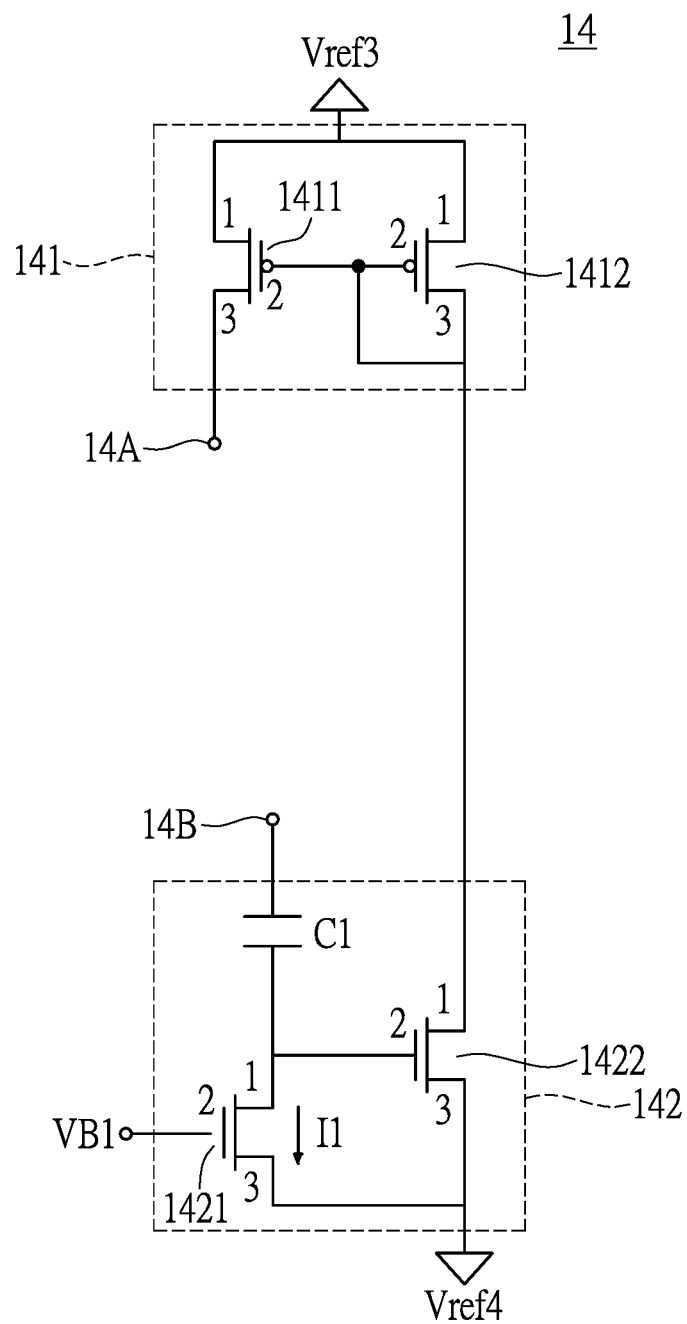
FIG. 2A is a schematic diagram of a first slew rate limiting module according to an embodiment of the present disclosure.
Figure 2B:
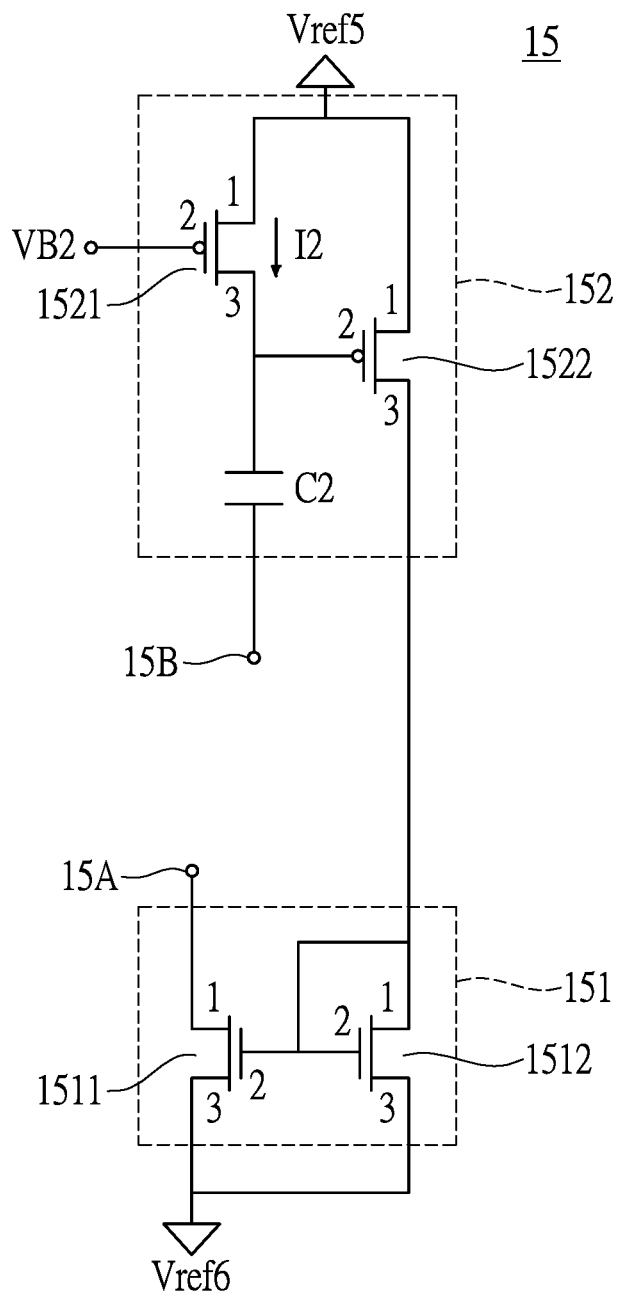
FIG. 2B is a schematic diagram of a second slew rate limiting module according to an embodiment of the present disclosure.

Referring to FIG. 1, FIG. 2A and FIG. 2B, FIG. 1 is a schematic diagram of a motor driving circuit according to an embodiment of the present disclosure, FIG. 2A is a schematic diagram of a first slew rate limiting module according to an embodiment of the present disclosure, and FIG. 2B is a schematic diagram of a second slew rate limiting module according to an embodiment of the present disclosure.

A motor driving circuit 1 is electrically connected to a motor (not shown), and provides an output current Iout to drive the motor (not shown).

In the present embodiment, the motor (not shown) is a voice coil motor, and modulates the working path according to the output current Iout provided by the motor driving circuit 1.

In the present embodiment, the motor driving circuit 1 is an amplifier circuit, and includes an input module 11, a gain module 12, an output module 13, a first slew rate limiting module 14 and a second slew rate limiting module 15.

In the present embodiment, a switch Q1, a switch Q2 and a switch Q3 of the input module 11 are the schematic diagram of a differential amplifier. The gate terminals of the switch Q1 and the switch Q2 are used for receiving the control signals of the system control circuit (not shown). The control signals can be transformed as an input signal, and the input signal can be provided to the gain module 12.

In the present embodiment, a switch Q4, a switch Q5, a switch Q6, a switch Q7, a switch Q8, a switch Q9, a switch Q10 and a switch Q11 of the gain module 12 are used for an amplifier circuit for magnifying the input signal of the input module and transmitting the magnified input signal to the output module 13. In the present embodiment, a bias circuit 121 of the gain module 12 is used for providing the gate voltage of the first output switch M1 and the gate voltage of the second output M2 of the output module 13. In the present embodiment, the bias circuit 121 is an AB-class amplifier.

In the present embodiment, the output module 13 includes a first output switch M1 and a second output switch M2. The first output switch M1 includes a first terminal, a second terminal, and a third terminal. The second output switch M2 includes a first terminal, a second terminal, and a third terminal. The output module 13 includes a first compensation capacitance CC1 and a second compensation capacitance CC2. In the present embodiment, the output module 13 further includes an output terminal OUT for outputting an output current Iout.

The first terminal of the output switch M1 is electrically connected to a first reference voltage Vref1. The second terminal of the first output switch M1 is electrically connected to a first terminal of the bias circuit 121 for receiving a first output control signal. The first compensation capacitance CC1 is located between the second terminal of the first output switch M1 and the third terminal of the first output switch M1. In other words, the first terminal of the first compensation capacitance CC1 is electrically connected to the second terminal of the first output switch M1 and the first terminal of the bias circuit 121. The third terminal of the first output switch M1 is electrically connected to the first terminal of the second output switch M2 and the output terminal OUT of the output module 13.

The first terminal of the second output switch M2 is electrically connected to the third terminal of the first output switch M1 and the output terminal OUT of the output module 13. The second terminal of the second output switch M2 is electrically connected to a second terminal of the bias circuit 121 of the gain module 12 for receiving a second output control signal. The second compensation capacitance CC2 is located between the first terminal of the second output switch M2 and the second terminal of the second output switch M2. In other words, the first terminal of the second compensation capacitance CC2 is electrically connected to the second terminal of the bias circuit 121 and the second terminal of the second output switch M2. The second terminal of the second compensation capacitance CC2 is electrically connected to the first terminal of the second output switch M2 and the output terminal OUT of the output module 13. In the present embodiment, the third terminal of the second output switch M2 is electrically connected to a second reference voltage Vref2.

In the present embodiment, the first reference voltage Vref1 is a voltage greater than 0V, such as 5V or 12V, but the present disclosure is not limited thereto. The second reference voltage Vref2 is a grounding voltage in the present embodiment, and can be −5V in other embodiments, but the present disclosure is not limited thereto.

The first slew rate limiting module 14 includes a first limiting terminal 14A and a second limiting terminal 14B. The first limiting terminal 14A of the first slew rate limiting module 14 is electrically connected to the second terminal of the first output switch M1. The second limiting terminal 14B of the first slew rate limiting module 14 is electrically connected to the output terminal OUT of the output module 13.

The first slew rate limiting module 14 includes a first current mirror unit 141 and a first limiting unit 142.

The first current mirror unit 141 includes a first current mirror switch 1411 and a second current mirror switch 1412. The first limiting unit 142 includes a first limiting capacitance C1, a first limiting switch 1421 and a second limiting switch 1422.

The first terminal of the first current mirror switch 1411 and the first terminal of the second current mirror switch 1412 are electrically connected to a third reference voltage Vref3. The second terminal of the first current mirror switch 1411 is electrically connected to the second terminal of the second current mirror switch 1412 and the third terminal of the second current mirror 1412. The third terminal of the first current mirror switch 1411 is electrically connected to the first limiting terminal 14A of the first slew rate limiting module 14. The first limiting terminal 14A is electrically connected to the second terminal of the first output switch M1. In other words, the third terminal of the first current mirror switch 1411 is electrically connected to the second terminal of the first output switch M1, and the second terminal of the first output switch M1 is the gate terminal. The third terminal of the second current mirror switch 1412 is electrically connected to the first terminal of the second limiting switch 1422. The third terminal of the first limiting switch 1412 is electrically connected to the first terminal of the second limiting switch 1422. The third terminal of the first limiting switch 1421 and the third terminal of the second limiting switch of the second limiting switch 1422 are electrically connected to a fourth voltage Vref4. The first terminal of the first limiting switch 1421 is electrically connected to the second terminal of the second limiting switch 1422. The second terminal of the first limiting 1421 is electrically connected to a first bias voltage VB1. The first terminal of the first limiting switch 1421 is electrically connected to the second terminal of the first limiting capacitance C1. The first terminal of the first limiting capacitance C1 is electrically connected to the second limiting terminal 14B of the first slew rate limiting module 14. The second limiting terminal 14B is electrically connected to the output terminal OUT of the output module 13. In other words, the first terminal of the first limiting capacitance C1 is electrically connected to the output terminal OUT of the output module 13.

In the present embodiment, the third reference voltage Vref3 is a voltage greater than 0V, such as 5V or 12V, but the present disclosure is not limited thereto. The fourth reference voltage Vref4 is a grounding voltage in the present embodiment, and can be −5V in other embodiments, but the present disclosure is not limited thereto.

In the present embodiment, the first current mirror switch 1411 and the second current mirror switch 1412 are respectively a P-type metal oxide semiconductor field effect transistor (P-MOSFET). The first limiting switch 1421 and the second limiting switch 1422 are respectively an N-type metal oxide semiconductor field effect transistor (N-MOSFET).

The second slew rate limiting module 15 includes a first limiting terminal 15A and a second limiting terminal 15B. The first limiting terminal 15A is electrically connected to the second terminal of the second output switch M2. The second limiting terminal 15B is electrically connected to the output terminal OUT of the output module 13.

The second slew rate limiting module 15 includes a second current mirror unit 151 and a second limiting unit 152. The second current mirror unit 151 includes a first current mirror switch 1511 and a second current mirror switch 1512. The second limiting unit 152 includes a second limiting capacitance C2, a first limiting switch 1521 and a second limiting switch 1522.

The third terminal of the first current mirror switch 1511 and the third terminal of the second current mirror switch 1512 are electrically connected to a sixth reference voltage Vref6.

The second terminal of the first current mirror switch 1511 is electrically connected to the second terminal of the second current mirror switch 1512 and the first terminal of the second current mirror switch 1512. The first terminal of the first current mirror switch 1511 is electrically connected to the first limiting terminal 15A of the second slew rate limiting module 15. The first limiting terminal 15A of the second slew rate limiting module 15 is electrically connected to the second terminal of the second output switch M2. In other words, the first terminal of the first current mirror switch 1511 is electrically connected to the second terminal of the second output switch M2, and the second terminal of the second output switch M2 is the gate terminal. The first terminal of the second output switch 1512 is electrically connected to the third terminal of the second limiting switch 1522. The first terminal of the first limiting switch 1521 and the first terminal of the second limiting switch 1522 are electrically connected to a fifth reference voltage Vref5.

In the present embodiment, the fifth reference voltage Vref5 is a voltage greater than 0V, such as 5V or 12V, but the present disclosure is not limited thereto. The sixth reference voltage Vref6 is a grounding voltage in the present embodiment, and can be −5V in other embodiments, but the present disclosure is not limited thereto.

The third terminal of the first limiting switch 1521 is electrically connected to the second terminal of the second limiting switch 1522.

The second terminal of the first limiting switch 1521 is electrically connected to a second bias voltage VB2. The third terminal of the first limiting switch 1521 is electrically connected to the first terminal of the second limiting capacitance C2. The second terminal of the second limiting capacitance C2 is electrically connected to the second limiting terminal 15B of the second slew rate limiting module 15. The second limiting terminal 15B of the second slew rate limiting module 15 is electrically connected to the output terminal OUT of the output module 13. In other words, the second terminal (the second limiting terminal 15B) of the second limiting capacitance C2 is electrically connected to the output terminal OUT of the output module 13.

In the present embodiment, the first current mirror switch 1511 and the second current mirror switch 1512 are respectively an N-type metal oxide-Semiconductor field effect transistor (N-MOSFET). The first limiting switch 1521 and the second limiting switch 1522 are respectively a P-type Metal Oxide-Semiconductor Field Effect Transistor (P-MOSFET).

In the present embodiment, when the first output control signal received by the second terminal of the first output switch M1 is "ON" state, the first output switch M1 is turned on. In the present embodiment, the output current Iout flows away the motor driving circuit 1. In other embodiments, the output current Iout flows into the motor driving circuit 1. In other words, the flow direction of the output circuit Iout is not limited in the present disclosure.

In the present embodiment, when the rising slew rate of the output current Iout is less than a first slew rate value, the first slew rate limiting module 14 does not operate. The first slew rate value can be set according to actual requirements, and the present disclosure is not limited thereto. In the industry, the slew rate specification, such as 55V/us-65V/us, is commonly used. In the present embodiment, the user can design the first slew rate value according to actual requirements.

When the rising slew of the output current Iout is greater than a first slew rate value, the first slew rate limiting module 14 operates. Simultaneously, the first limiting switch 1421 of the first limiting unit 142 is controlled by the first bias voltage VB1. A part of the output current Iout flows through the first limiting switch 1421. The current flowing through the first limiting switch 1421 is a first limiting current I1. When the first limiting switch 1421 is turned on, the second terminal (gate terminal) of the second limiting switch 1422 has a high voltage such that the second limiting switch 1422 is turned on. Due to the operation of the second limiting switch 1422, the first current mirror switch 1411 and the second current mirror switch 1412 of the first current mirror unit 141 are together in operation. Therefore, a coupling current corresponding to the first limiting current I1 flows through the first limiting 14A of the first slew rate limiting module 14 such that the voltage of the second terminal (gate terminal) of the first output switch M1 increases. In the present embodiment, the first output switch M1 is a P-MOSFET. When the voltage of the second terminal (gate terminal) of the first output switch M1 is increased, the voltage difference between the first terminal and the second terminal of the first output switch M1 is reduced, such that the channel in the first output switch M1 is reduced. The output speed of the output current Iout is limited accordingly. Namely, the rising slew rate of the output current Iout is influenced by a first limiting parameter of the first slew rate limiting module 14. The rising slew rate of the first output current Iout1 is described as the equation 1.

$$SRise = \frac{dIout}{dt} = \frac{I1}{C1} - \qquad \text{equation 1}$$

I1 is the first limiting current, and C1 is the first limiting capacitance. The ratio of the first limiting current I1 and the first limiting capacitance C1 is the first limiting parameter of the first slew rate limiting module 14.

In the present embodiment, the first limiting parameter can be set according to the first slew rate value, namely, the first limiting current I1 and the first limiting capacitance C1 can be set according to the first slew rate value for matching the slew rate specification.

In the present embodiment, when the falling slew rate of the output current Iout is less than a second slew rate value, the second slew rate limiting module 15 does not operate. The second slew rate value can be set according to actual requirements, and the present disclosure is not limited thereto.

In the present embodiment, when the output control signal received by the second terminal of the second output switch M2 is "ON" state, the second output switch is turned on. When the falling slew of the output current Iout is less than a second slew rate value, the second slew rate limiting module 15 operates. Simultaneously, the first limiting switch 1521 of the second limiting unit 152 is controlled by the second bias voltage VB2. A part of the output current Iout flows through the first limiting switch 1521. The current flowing through the first limiting switch 1521 is a second limiting current I2. When the first limiting switch 1521 is turned on, the second terminal (gate terminal) of the second limiting switch 1522 has a high voltage such that the second limiting switch 1522 is turned on. Due to the operation of the second limiting switch 1522, the first current mirror switch 1511 and the second current mirror switch 1512 of the second current mirror unit 151 are together in operation. Therefore, a coupling current corresponding to the second current I2 flows through the first limiting terminal 15A of the second slew rate limiting module 15 such that the voltage of the second terminal (gate terminal) of the second output switch M2 is decreased. In the present embodiment, the second output switch M2 is an N-MOSFET. When the voltage of the second terminal (gate terminal) of the second output switch M2 is decreased, the voltage difference between the third terminal and the second terminal of the second output switch M2 is reduced, such that the channel in the second output switch M2 is reduced. The output speed of the output current Iout is limited accordingly. Namely, the falling slew rate of the output current Iout is influenced by a second limiting parameter of the second slew rate limiting module 15. The falling slew rate of the first output current Iout is described as the equation 2.

$$SRfall = \frac{dIout}{dt} = \frac{I2}{C2} - \qquad \text{equation 2}$$

I2 is the second limiting current, and C2 is the second limiting capacitance. The ration of the second limiting current I2 and the second limiting capacitance C2 is the second limiting parameter of the second slew rate limiting module 15.

In the present embodiment, the second limiting parameter can be set according to the second slew rate value, namely, the second limiting current I2 and the second limiting capacitance C2 can be set according to the second slew rate value for matching the slew rate specification.

According to the above, in the amplifier-type motor driving circuit of the present disclosure, the first output switch and the second switch are electrically and respectively connected to a slew rate limiting module. Regardless of the direction of the output current, the rising slew rate and the falling slew rate can be limited in a range. In addition, the circuit of the slew rate limiting module has a simple design and is separated from the original driving circuit. Accordingly, the parameters of the original driving circuit are not influenced, and the rising slew rate and the falling slew rate can be effectively adjusted. In addition, the process yield can be improved and cost-effective, thereby reducing the development schedule of driving devices.

The above-mentioned descriptions represent merely the exemplary embodiments of the instant disclosure, without any intention to limit the scope of the instant disclosure thereto. Various equivalent changes, alterations or modifications based on the claims of present disclosure are all consequently viewed as being embraced by the scope of the instant disclosure.

What is claimed is:
1. A motor driving circuit for receiving a control signal to output at least one output current for driving a motor, the motor driving circuit comprising:
   an input module for receiving the control signal and transforming the control signal as an input signal;
   a gain module electrically connected to the input module for receiving and amplifying the input signal;
   an output module electrically connected to the gain module, wherein the output module includes an output terminal; the output module including:
   a first output switch including a first terminal, a second terminal and a third terminal, wherein the second terminal of the first output switch is used for receiving a first output control signal of the gain module;
   a second output switch including a first terminal, a second terminal and a third terminal, wherein the second terminal of the second output switch is used for receiving a second output control signal of the gain module, and the first terminal of the second output switch is electrically connected to the third terminal of the first output switch;
   a first slew rate limiting module including a first limiting terminal and a second limiting terminal, the first limiting terminal electrically connected to the output terminal of the output module, and the second limiting terminal electrically connected to the second terminal of the first output switch, wherein the first slew rate limiting module has a first limiting parameter; and
   a second slew rate limiting module including a first limiting terminal and a second limiting terminal, the first limiting terminal electrically connected to the output terminal of the output module, and the second limiting terminal electrically connected to the second terminal of the second output switch, wherein the second slew rate includes a second limiting parameter;

wherein an output current is outputted by the output terminal of the output module; when a rising slew rate of the output current is less than a first slew rate value, the first slew rate limiting module does not operate; when the rising slew rate of the output current is greater than the first slew rate value, the motor driving circuit limits the rising slew rate of the output current based on the first limiting parameter of the first slew rate limiting module;

wherein the first slew rate limiting module comprises:
a first current mirror unit including:
a first current mirror switch including a first terminal, a second terminal and a third terminal, the first terminal of the first current mirror switch electrically connected to a first reference voltage; and
a second current mirror switch including a first terminal, a second terminal and a third terminal, the first terminal of the second current mirror switch electrically connected to the first reference voltage; and
a first limiting unit including:
a first limiting capacitance including a first terminal and a second terminal;
a first limiting switch including a first terminal, a second terminal and a third terminal; and
a second limiting switch including a first terminal, a second terminal and a third terminal, wherein the third terminal of the first limiting switch and the third terminal of the second limiting switch are electrically connected a second reference voltage; and
wherein the second terminal of the first current mirror switch is electrically connected to the second terminal of the second current mirror switch and the third terminal of the second current mirror switch, the third terminal of the first current mirror switch is electrically connected to the first limiting terminal of the first slew rate limiting module, the third terminal of the second current mirror switch is electrically connected to the first terminal of the second limiting switch, the first terminal of the first limiting switch is electrically connected to the second terminal of the second limiting switch, the second terminal of the first limiting switch is electrically connected to a first bias voltage, the first terminal of the first limiting switch is electrically connected to the second terminal of the first limiting capacitance, and the first terminal of the first limiting capacitance is electrically connected to the second limiting terminal of the first slew rate limiting module.

2. The motor driving circuit of claim 1, wherein when a falling slew rate of the output current is less than a second slew rate value, the second slew rate limiting module does not operate; when the falling slew rate of the output current is greater than the second slew rate value, the motor driving circuit limits the falling slew rate of the output current based on the second limiting parameter of the second slew rate limiting module.

3. The motor driving circuit of claim 1, wherein the first terminal of the first output switch is electrically connected to a third reference voltage, the second terminal of the first output switch is electrically connected to the gain module, the third terminal of the first output switch is electrically connected to the first terminal of the second output switch and the output terminal of the output module, the second terminal of the second output switch is electrically connected to the gain module, and the third terminal of the second output switch is electrically connected to a fourth reference voltage.

4. The motor driving circuit of claim 1, wherein the second slew rate limiting module comprises:
a second current mirror unit including:
a first current mirror switch including a first terminal, a second terminal and a third terminal, the third terminal of the first current mirror switch electrically connected to a sixth reference voltage; and
a second current mirror switch including a first terminal, a second terminal and a third terminal, the third terminal of the second current mirror switch electrically connected to the sixth reference voltage; and
a second limiting unit including:
a second limiting capacitance including a first terminal and a second terminal;
a first limiting switch including a first terminal, a second terminal and a third terminal; and
a second limiting switch including a first terminal, a second terminal and a third terminal, wherein the first terminal of the first limiting switch and the first terminal of the second limiting switch are electrically connected to a fifth reference voltage;
wherein the second terminal of the first current mirror switch of the second current mirror unit is electrically connected to the second terminal of the second current mirror switch of the second current mirror unit and the first terminal of the second current mirror switch of the second current mirror unit, the first terminal of the first current mirror switch of the second current mirror unit is electrically connected to the first limiting terminal of the second slew rate limiting module, the first terminal of the second current mirror switch of the second current mirror unit is electrically connected to the third terminal of the second limiting switch of the second limiting unit, the third terminal of the first limiting switch of the second limiting unit is electrically connected to the second terminal of the second limiting switch, the second terminal of the first limiting switch of the second limiting unit is electrically connected to a second bias voltage, the third terminal of the first limiting switch of the second limiting unit is electrically connected to the first terminal of the second limiting capacitance, and the second terminal of the second limiting capacitance is electrically connected to the second limiting terminal of the second slew rate limiting module.

5. The motor driving circuit of claim 1, wherein the first limiting parameter is determined according to a first limiting current flowing through the first limiting switch of the first slew rate limiting module and a capacitance value of the first limiting capacitance.

6. The motor driving circuit of claim 4, wherein the second limiting parameter is determined according to a second limiting current flowing through the first limiting switch of the second slew rate limiting module and a capacitance value of the second limiting capacitance.

7. A motor driving circuit for receiving a control signal to output at least one output current for driving a motor, the motor driving circuit comprising:
an input module receiving the control signal and transforming the control signal as an input signal;
a gain module electrically connected to the input module for receiving and amplifying the input signal;
an output module electrically connected to the gain module, wherein the output module includes an output terminal, the output module including:
a first output switch including a first terminal, a second terminal and a third terminal, wherein the second terminal of the first output switch is used for receiving a first output control signal of the gain module;

a second output switch including a first terminal, a second terminal and a third terminal, wherein the second terminal of the second output switch is used for receiving a second output control signal of the gain module, the first terminal of the second output switch is electrically connected to the third terminal of the first output switch; and a first slew rate limiting module including a first limiting terminal and a second limiting terminal, the first limiting terminal electrically connected to the output terminal of the output module, the second limiting terminal electrically connected to the second terminal of the first output switch, wherein the first slew rate limiting module includes a first limiting parameter;

wherein an output current is outputted by the output terminal of the output module, when a rising slew rate of the output current is less than a first slew rate value, the first slew rate limiting module does not operate, when the rising slew rate of the output current is greater than the first slew rate value, the motor driving circuit limits the rising slew rate of the output current based on the first limiting parameter of the first slew rate limiting module;

wherein the first slew rate limiting module comprises:

a first current mirror unit, including:
  a first current mirror switch including a first terminal, a second terminal and a third terminal, the first terminal of the first current mirror switch electrically connected to a first reference voltage; and
  a second current mirror switch including a first terminal, a second terminal and a third terminal, the first terminal of the second current mirror switch electrically connected to the first reference voltage; and a first limiting unit including:
  a first limiting capacitance including a first terminal and a second terminal;
  a first limiting switch including a first terminal, a second terminal and a third terminal; and
  a second limiting switch including a first terminal, a second terminal and a third terminal, wherein the third terminal of the first limiting switch and the third terminal of the second limiting switch are electrically connected a second reference voltage; and wherein the second terminal of the first current mirror switch is electrically connected to the second terminal of the second current mirror switch and the third terminal of the second current mirror switch, the third terminal of the first current mirror switch is electrically connected to the first limiting terminal of the first slew rate limiting module, the third terminal of the second current mirror switch is electrically connected to the first terminal of the second limiting switch, the first terminal of the first limiting switch is electrically connected to the second terminal of the second limiting switch, the second terminal of the first limiting switch is electrically connected to a first bias voltage, the first terminal of the first limiting switch is electrically connected to the second terminal of the first limiting capacitance, and the first terminal of the first limiting capacitance is electrically connected to the second limiting terminal of the first slew rate limiting module.

8. The motor driving circuit of clam 7, further comprising:

a second slew rate limiting module including a first limiting terminal and a second limiting terminal, the first limiting terminal electrically connected to the output terminal of the output module, the second limiting terminal electrically connected to the second terminal of the second output switch, wherein the second slew rate includes a second limiting parameter;

wherein when a falling slew rate of the output current is less than a second slew rate value, the second slew rate limiting module does not operate, when the falling slew rate of the output current is greater than the second slew rate value, the motor driving circuit limits the falling slew rate of the output current based on the second limiting parameter of the second slew rate limiting module.

9. The motor driving circuit of claim 8, wherein the first terminal of the first output switch is electrically connected to a third reference voltage, the second terminal of the first output switch is electrically connected to the gain module, the third terminal of the first output switch is electrically connected to the first terminal of the second output switch and the output terminal of the output module, the second terminal of the second output switch is electrically connected to the gain module, and the third terminal of the second output switch is electrically connected to a fourth reference voltage.

10. The motor driving circuit of claim 8, wherein the second slew rate limiting module comprises:

a second current mirror unit including:
  a first current mirror switch including a first terminal, a second terminal and a third terminal, the third terminal of the first current mirror switch electrically connected to a sixth reference voltage; and
  a second current mirror switch including a first terminal, a second terminal and a third terminal, the third terminal of the second current mirror switch electrically connected to the sixth reference voltage; and a second limiting unit including:
  a second limiting capacitance including a first terminal and a second terminal;
  a first limiting switch including a first terminal, a second terminal and a third terminal; and
  a second limiting switch including a first terminal, a second terminal and a third terminal, wherein the first terminal of the first limiting switch and the first terminal of the second limiting switch are electrically connected to a fifth reference voltage;

wherein the second terminal of the first current mirror switch of the second current mirror unit is electrically connected to the second terminal of the second current mirror switch of the second current mirror unit and the first terminal of the second current mirror switch of the second current mirror unit, the first terminal of the first current mirror switch of the second current mirror unit is electrically connected to the first limiting terminal of the second slew rate limiting module, the first terminal of the second current mirror switch of the second current mirror unit is electrically connected to the third terminal of the second limiting switch of the second limiting unit, the third terminal of the first limiting switch of the second limiting unit is electrically connected to the second terminal of the second limiting switch of the second limiting unit, the second terminal of the first limiting switch of the second limiting unit is electrically connected to a second bias voltage, the third terminal of the first limiting switch of the second limiting unit is electrically connected to the first terminal of the second limiting capacitance, and the second terminal of the second limiting capacitance is electrically connected to the second limiting terminal of the second slew rate limiting module.

11. The motor driving circuit of claim 10, wherein the first limiting parameter is determined according to a first limiting current flowing through the first limiting switch of the first slew rate limiting module and a capacitance value of the first limiting capacitance.

12. The motor driving circuit of claim 11, wherein the second limiting parameter is determined according to a second limiting current flowing through the first limiting switch of the second slew rate limiting module and a capacitance value of the second limiting capacitance.

13. A motor driving circuit for receiving a control signal to output at least one output current for driving a motor, the motor driving circuit comprising:
an input module for receiving the control signal and transforming the control signal as an input signal;
a gain module electrically connected to the input module for receiving and amplifying the input signal;
an output module electrically connected to the gain module, wherein the output module includes an output terminal; the output module including:
a first output switch including a first terminal, a second terminal and a third terminal, wherein the second terminal of the first output switch is used for receiving a first output control signal of the gain module;
a second output switch including a first terminal, a second terminal and a third terminal, wherein the second terminal of the second output switch is used for receiving a second output control signal of the gain module, and the first terminal of the second output switch is electrically connected to the third terminal of the first output switch;
a first slew rate limiting module including a first limiting terminal and a second limiting terminal, the first limiting terminal electrically connected to the output terminal of the output module, and the second limiting terminal electrically connected to the second terminal of the first output switch, wherein the first slew rate limiting module has a first limiting parameter; and
a second slew rate limiting module including a first limiting terminal and a second limiting terminal, the first limiting terminal electrically connected to the output terminal of the output module, and the second limiting terminal electrically connected to the second terminal of the second output switch, wherein the second slew rate includes a second limiting parameter;
wherein an output current is outputted by the output terminal of the output module; when a rising slew rate of the output current is less than a first slew rate value, the first slew rate limiting module does not operate; when the rising slew rate of the output current is greater than the first slew rate value, the motor driving circuit limits the rising slew rate of the output current based on the first limiting parameter of the first slew rate limiting module;
wherein the second slew rate limiting module comprises:
a first current mirror unit including:
a first current mirror switch including a first terminal, a second terminal and a third terminal, the third terminal of the first current mirror switch electrically connected to a first reference voltage; and
a second current mirror switch including a first terminal, a second terminal and a third terminal, the third terminal of the second current mirror switch electrically connected to the first reference voltage; and
a first limiting unit including:

a first limiting capacitance including a first terminal and a second terminal;
a first limiting switch including a first terminal, a second terminal and a third terminal; and
a second limiting switch including a first terminal, a second terminal and a third terminal, wherein the first terminal of the first limiting switch and the first terminal of the second limiting switch are electrically connected to a second reference voltage; and
wherein the second terminal of the first current mirror switch is electrically connected to the second terminal of the second current mirror switch and the first terminal of the second current mirror switch, the first terminal of the first current mirror switch is electrically connected to the first limiting terminal of the second slew rate limiting module, the first terminal of the second current mirror switch is electrically connected to the third terminal of the second limiting switch, the third terminal of the first limiting switch is electrically connected to the second terminal of the second limiting switch, the second terminal of the first limiting switch is electrically connected to a first bias voltage, the third terminal of the first limiting switch is electrically connected to the first terminal of the first limiting capacitance, and the second terminal of the first limiting capacitance is electrically connected to the second limiting terminal of the second slew rate limiting module.

14. The motor driving circuit of claim 13, wherein when a falling slew rate of the output current is less than a second slew rate value, the second slew rate limiting module does not operate; when the falling slew rate of the output current is greater than the second slew rate value, the motor driving circuit limits the falling slew rate of the output current based on the second limiting parameter of the second slew rate limiting module.

15. The motor driving circuit of claim 13, wherein the first terminal of the first output switch is electrically connected to a third reference voltage, the second terminal of the first output switch is electrically connected to the gain module, the third terminal of the first output switch is electrically connected to the first terminal of the second output switch and the output terminal of the output module, the second terminal of the second output switch is electrically connected to the gain module, and the third terminal of the second output switch is electrically connected to a fourth reference voltage.

16. The motor driving circuit of claim 13, wherein the first slew rate limiting module comprises:
a second current mirror unit, including:
a first current mirror switch including a first terminal, a second terminal and a third terminal, the first terminal of the first current mirror switch electrically connected to a fifth reference voltage; and
a second current mirror switch including a first terminal, a second terminal and a third terminal, the first terminal of the second current mirror switch electrically connected to the fifth reference voltage; and
a second limiting unit including:
a second limiting capacitance including a first terminal and a second terminal;
a first limiting switch including a first terminal, a second terminal and a third terminal; and
a second limiting switch including a first terminal, a second terminal and a third terminal, wherein the third terminal of the first limiting switch and the third terminal of the second limiting switch are electrically connected a sixth reference voltage;

wherein the second terminal of the first current mirror switch of the second current mirror unit is electrically connected to the second terminal of the second current mirror switch of the second current mirror unit and the third terminal of the second current mirror switch of the second current mirror unit, the third terminal of the first current mirror switch of the second current mirror unit is electrically connected to the first limiting terminal of the first slew rate limiting module, the third terminal of the second current mirror switch of the second current mirror unit is electrically connected to the first terminal of the second limiting switch of the second limiting unit, the first terminal of the first limiting switch of the second limiting unit is electrically connected to the second terminal of the second limiting switch of the second limiting unit, the second terminal of the first limiting switch of the second limiting unit is electrically connected to a second bias voltage, the first terminal of the first limiting switch of the second limiting unit is electrically connected to the second terminal of the second limiting capacitance, and the first terminal of the second limiting capacitance is electrically connected to the second limiting terminal of the first slew rate limiting module.

17. The motor driving circuit of claim 16, wherein the first limiting parameter is determined according to a first limiting current flowing through the first limiting switch of the first slew rate limiting module and a capacitance value of the second limiting capacitance.

18. The motor driving circuit of claim 13, wherein the second limiting parameter is determined according to a second limiting current flowing through the first limiting switch of the second slew rate limiting module and a capacitance value of the first limiting capacitance.

* * * * *